(12) United States Patent
Rosenthal et al.

(10) Patent No.: US 6,184,757 B1
(45) Date of Patent: Feb. 6, 2001

(54) CRYOGENIC ELECTRONIC ASSEMBLY

(75) Inventors: Keith Ronald Rosenthal; Ramanlal Chhiba Mistry, both of Southampton; Robert Brian Greed, Colchester, all of (GB)

(73) Assignee: GEC-Marconi Limited, Middlesex (GB)

( * ) Notice: Under 35 U.S.C. 154(b), the term of this patent shall be extended for 0 days.

(21) Appl. No.: 09/089,447

(22) Filed: Jun. 3, 1998

(30) Foreign Application Priority Data

Jun. 3, 1997 (GB) .................................................. 9711379

(51) Int. Cl.$^7$ ................................ H01P 3/08; H01P 1/00; H01P 5/00
(52) U.S. Cl. ........................ 333/99 S; 333/246; 333/260
(58) Field of Search ................................... 333/246, 260, 333/99 R, 99 S

(56) References Cited

U.S. PATENT DOCUMENTS

| | | | |
|---|---|---|---|
| 4,451,735 | * 5/1984 | Diedrich et al. | 250/352 |
| 4,686,492 | * 8/1987 | Grellmann et al. | 333/260 X |
| 4,761,681 | 8/1988 | Reid | 357/68 |
| 4,983,840 | 1/1991 | Ouvrier-Buffet et al. | 250/352 |
| 4,995,236 | 2/1991 | Rouquier et al. | 62/51.1 |
| 5,103,097 | 4/1992 | Montanari | 250/352 |
| 5,294,897 | * 3/1994 | Notani et al. | 333/33 |
| 5,543,662 | 8/1996 | Burward-Hoy | 257/716 |
| 5,583,468 | * 12/1996 | Kielmeyer et al. | 333/260 X |
| 5,619,039 | 4/1997 | Montanari | 250/352 |

FOREIGN PATENT DOCUMENTS

| | | |
|---|---|---|
| 0318309 | 5/1989 | (EP) . |
| 364347 | 10/1989 | (EP) . |
| 0543033 | 5/1993 | (EP) . |
| 0650192 | 4/1995 | (EP) . |
| WO8703152 | 5/1987 | (WO) . |

* cited by examiner

*Primary Examiner*—Robert Pascal
*Assistant Examiner*—Barbara Summons
(74) *Attorney, Agent, or Firm*—Donald C. Casey, Esq.

(57) ABSTRACT

A number of electronic modules 82, 82', 83, 83' are mounted on a cold finger 100 disposed within a sealed housing 104, 110, the interior 210 of which is evacuated. To minimize heat transfer by conduction, gaps are provided in the dielectric substrates carrying the input and output transmission lines providing signal paths between the modules and electrical connectors on the exterior sidewalls 106, 108 of the housing. The gaps are bridged by thin conductive wires, thereby providing low electrical, but high thermal, impedance at the gaps. A number of module assemblies may be stacked on a single cold finger. To allow modules to be adjusted under actual operating conditions, a cover having a number of spring-loaded screwdrivers extending through vacuum tight seals and aligned with adjustable components of the modules, may be temporarily substituted for the enclosure lid 110. The springs urge the screwdrivers out of engagement when no adjustment is being made to minimize heat transfer.

11 Claims, 4 Drawing Sheets

CRYOGENIC ELECTRONIC ASSEMBLY

This invention relates to electronic modules. It particularly relates to assemblies operating at cryogenic temperatures.

BACKGROUND OF THE INVENTION

A known technique of operating electronic components at cryogenic temperatures is to mount the components on a so-called "cold finger" within an evacuated chamber. A problem can arise in making electrical connections between the exterior of the enclosure, which may be at ambient temperature, and the electronic components, which are at cryogenic temperatures, in that electrically conductive signal paths also provide thermally conductive paths. The more connecting paths, the greater the conducted heat and the heavier the loading on the cryogenic cooler. This is a particular problem with radio-frequency signal paths where conductor dimensions are determined by the need to maintain a good impedance match and may involve the provision of a conducting ground plane. The coupling paths also need to allow for the thermal expansion and contraction which may arise due to the thermally-produced movement between the components and the enclosure which occurs when the assembly is being brought to its cryogenic operating temperature or returns to ambient temperature when the apparatus is shut down.

In one known approach, each path comprises a length of coaxial cable extending between the walls of the enclosure and the cryogenic components. However this known arrangement suffers the disadvantage that, in order to minimise heat loss by conduction, the cable must be made relatively long. While this arrangement has proved satisfactory where a small number of signal paths is concerned, for large numbers of paths, the large number of parallel paths provides a correspondingly reduced thermal resistance, leading to a proportional increase in heat load. Another disadvantage is that coaxial cable will inevitably contain a certain amount of trapped gas which will progressively leak into the vacuum space over a period of time. This gas will provide another mechanism for heat transfer by convection or conduction between ambient and the cold component. The longer the cable, the greater the potential for out gassing of trapped gases. The user then has the inconveniences of having to periodically re-pump the enclosure to restore vacuum.

Another problem which can arise concerns adjustment of adjustable components such as tuning screws which may be necessary when setting up a circuit operating at cryogenic temperatures.

The present invention seeks to ameliorate the above disadvantages of the prior art.

BRIEF SUMMARY OF THE INVENTION

In accordance with a first aspect of the invention there is provided a circuit assembly comprising a first substrate having a first stripline conductor arranged on a first surface thereof and having an end terminating at an edge of the first substrate, a second substrate having a second stripline conductor arranged on a first surface thereof and having an end terminating at an edge of the second substrate, means to align the first and second substrates with their edges spaced apart with the respective ends of the striplines aligned, respective first and second wire links extending between respective longitudinal edges of the end of the first stripline conductor and corresponding edges of the end of the second stripline conductor.

In accordance with a second aspect of the invention there is provided apparatus for adjusting a circuit operated at cryogenic temperatures comprising an evacuable housing, and means for mounting a circuit to be adjusted within the evacuable housing, the apparatus comprising a cover for the housing arranged to be hermetically sealed to the housing, the cover comprising at least one adjuster disposed in a through bore in the cover, the bore having seal means arranged to cooperate with the adjuster and provide hermetic seal therewith while allowing movement of the adjuster relative to the cover, the other end of the adjuster being arranged to cooperate with an adjustable member of the circuit whereby the circuit can be adjusted from the exterior of the housing when the interior of the housing is evacuated.

In the present specification the expression "stripline" refers to transmission lines in which at least one conductor comprises a planar conductive member arranged on a substrate. It includes but is not limited to, microstrip and stripline configurations and balanced and unbalanced configurations.

BRIEF DESCRIPTION OF THE DRAWINGS

Embodiments of the invention will now be described by way of non-limiting example only, with reference to the drawings in which.

DETAILED DESCRIPTION OF THE INVENTION

Figure 1:
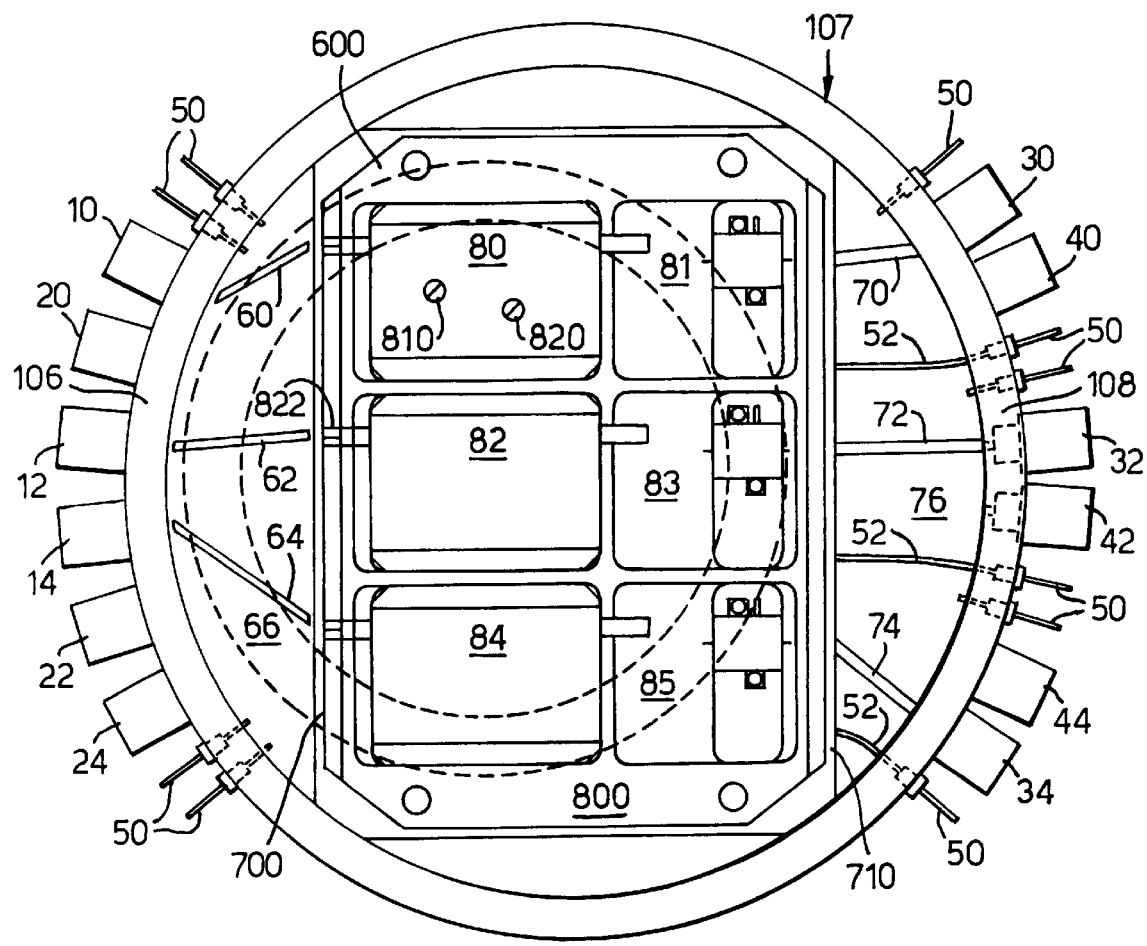
FIG. 1, shows a plan view of a cryogenic assembly in accordance with the invention.
Figure 2:
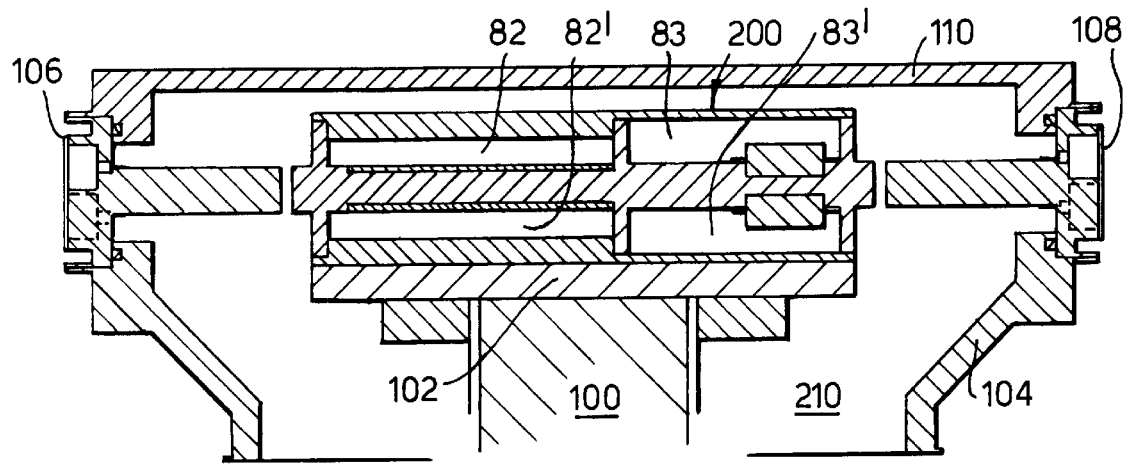
FIG. 2 shows a cross section of FIG. 1.

Referring now to FIGS. 1 and 2, a cold finger 100 forms part of a cooling engine which in the present embodiment is capable of attaining a temperature in the order of 60 K. The cold finger 100 terminates in a cold platform 102 on which is mounted an assembly 200 comprising a number of electronic circuit modules. In the present embodiment, the assembly 200 is of double-sided construction. The upper surface has three channels comprising sub-assemblies 80, 81; 82, 83; and 84, 85 respectively. Module 80 is provided with tuning screws 810, 820 for tuning purposes. For clarity, only two tuning screws have been shown. In practice any number of tuning screws may be provided according to circuit requirements. Modules 82, 84 have corresponding screws but these have been omitted for clarity. The lower surface has three further channels of which only 82', 83' are shown in FIG. 2. The cold finger 100, 102 and circuit assembly 200 are surrounded by an enclosure defined by a lower portion 104, an annular intermediate portion 107, and top portion 110. Intermediate portion 107 carries electrical connectors and will be referred to as the connector ring.

As will be described later, to facilitate adjustment an adjustment assembly 600, shown in phantom on FIG. 1, may be temporarily utilised in place of top portion 110 to facilitate adjustment while maintaining a vacuum.

The space 210 between the outer enclosure and the cryogenic components is evacuated. Respective lateral portions 106, 108 connector ring 107 carry the respective input and output connectors for radio-frequency signals and other supply and sensor circuits. In the present embodiment the radio frequency connectors comprise "K" connectors, but any suitable type may of course be used. Input connectors 10, 12, 14 provide inputs to the upper modules 80, 82, 84. Input connectors 20, 22, 24 comprise connections of the lower modules, not shown. Output signals from output stages 81, 83, 85 appear at output connectors 30, 32, 34 respectively. Output signals from the corresponding output stages on the lower surface appear at connectors 40, 42, 44. The input signal path from the input connectors 10, 12, 14, to their respective modules 80, 82, 84 are via respective strip line transmission lines 60, 62, 64 on a substrate 66. Corresponding transmission lines, not shown, provide paths to the lower modules. Similarly the output signal paths from output stages 81, 83, 85 are via strip transmission lines 70, 72, 74 on substrate 76. The corresponding strip transmission lines for the lower modules are not shown for clarity. The input substrate 66 and output substrate 76 are mounted on the respective lateral walls 106, 108. Feedthrough members 50 provide DC bias connections via respective conductive tracks 52. Respective gaps 700, 710 provide respective thermal breaks between the substrates 66, 76 and the assembly 200 at cryogenic temperature.

The electrical connections to the cryogenic assembly will now be described. Only the input connection will be described in detail. The output connection is made in the same manner.

Figure 3:
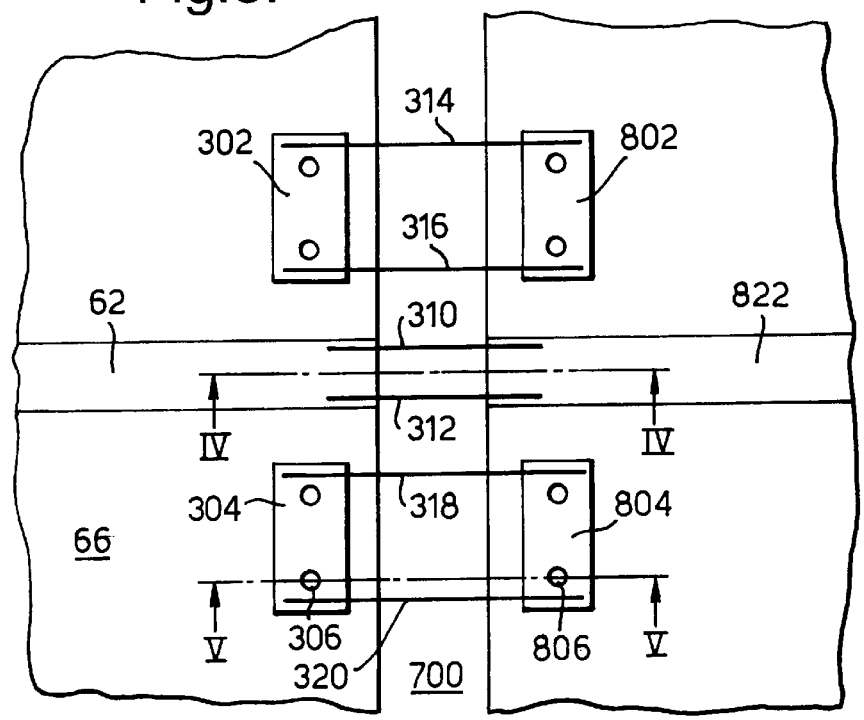
FIG. 3 shows a plan view on an enlarged scale of a connection in accordance with the invention.
Figure 4:
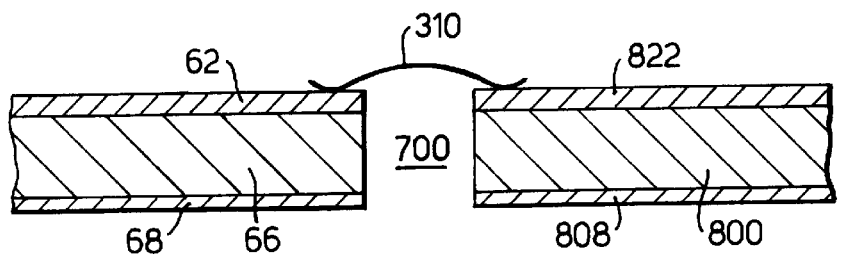
FIG. 4 shows a section view of FIG. 3 along iv—iv.
Figure 5:
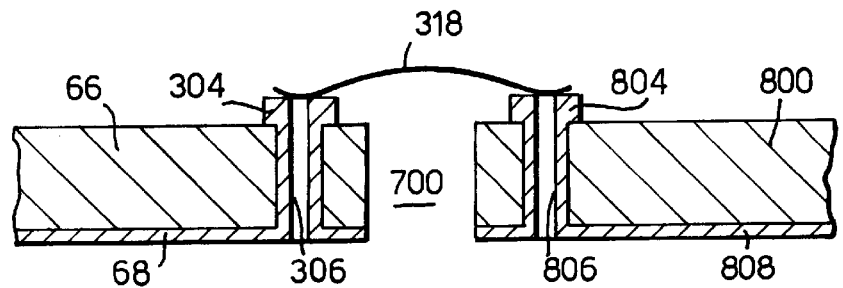
FIG. 5 shows a sectioned view of FIG. 3 along v—v.

Referring to FIGS. 3–5, a substrate 66 has an input transmission strip line 62 on a first surface. The other surface carries a ground plane 68. A substrate 800 has an input strip line 822 on its first surface and a ground plane 808 on its opposite surface. The substrates are spaced apart by a vacuum space 700 providing a thermal break. Electrical connection between the strip lines 62, 822 are by way of a pair of thin wire links 310, 312 arranged adjacent opposite edges of the strip lines 62, 822. The links 310, 312 are arranged close to the edges of the strip lines 62, 822. To provide a connection between the ground planes 68, 808, the first substrate 66 has first and second pads 302, 304 arranged on its upper surface on either side of the strip line 62. Connection between the ground plane 68 and the pads 302, 304 are via through-plated holes 306. Corresponding pads 804, 802 are provided on the other substrate 800 with corresponding through-plated holes 806. A plurality of links 314, 316, 318, 320 provide the necessary ground plane connections. It will be seen that, as compared with the relatively large cross-section of a coaxial cable, in accordance with the present invention the thermal path is that of a relatively thin wire links 310–320. The present embodiment utilises wire of about 25 μm diameter as used in bonding integrated circuits and thick-film circuit assemblies.

It is believed that the RF signals in a strip transmission line tend to be concentrated at the edges of the strip conductors. Thus links situated at the extreme edges of the strip line provide conductive paths at locations where most of the RF signal is situated, and it has been found that the discontinuity in the stripline presented by the links has a relatively small effect on the characteristic impedance of the stripline.

Despite the relatively good thermal conductivity of conventional bonding wire, the relatively small cross-sectional area of the wire limits the amount of heat flow through the wire by conduction. Hence any conventional bond wire, such as Aluminium or Gold, may be used.

To further reduce heat flow by conduction, wire of a metal having a relatively poor thermal conductivity may be employed. As will be evident to the man skilled in the art, the choice of such a metal will be determined by metallurgical factors such as compatibility with the metal used for the stripline conductors, as well as thermal properties.

As mentioned above, it is sometimes the case that certain circuit elements require tuning for optimum performance. This has hitherto been a problem insofar as the circuit to be tuned is, in operation, completely enclosed within the vacuum-tight housing. In order to allow the circuit to be tuned under true operating conditions, in accordance with the invention an adjustment assembly is provided which seals the vacuum enclosure yet which allows the adjusting screws to be adjusted.

Figure 6:
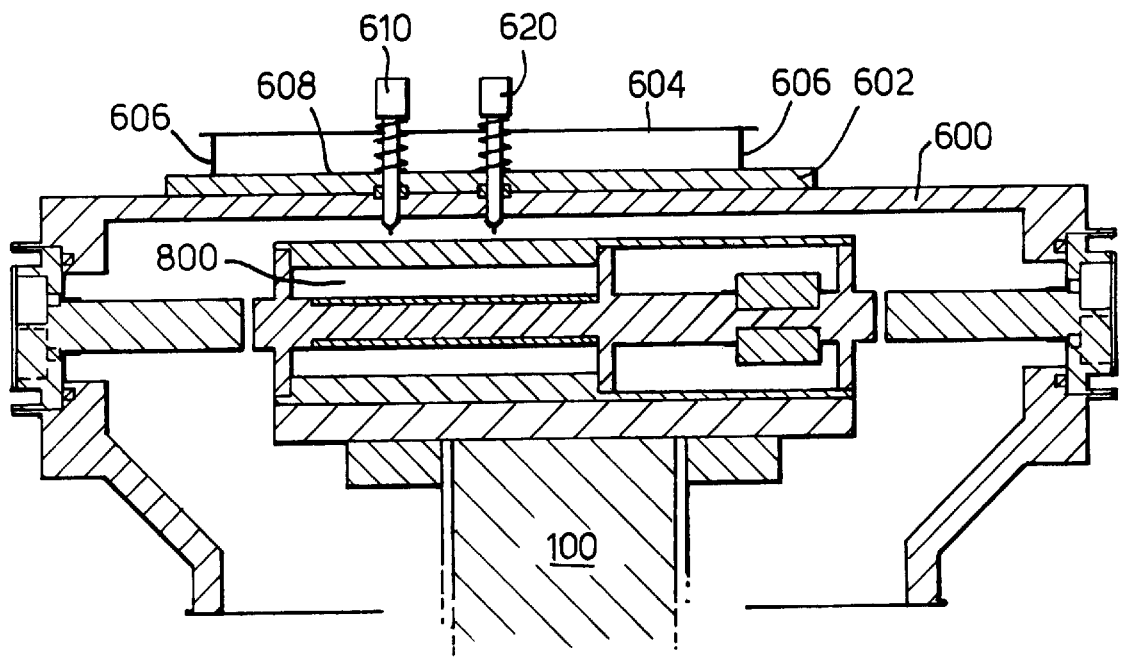
FIG. 6 shows a section view of a further aspect of the invention.
Figure 7:
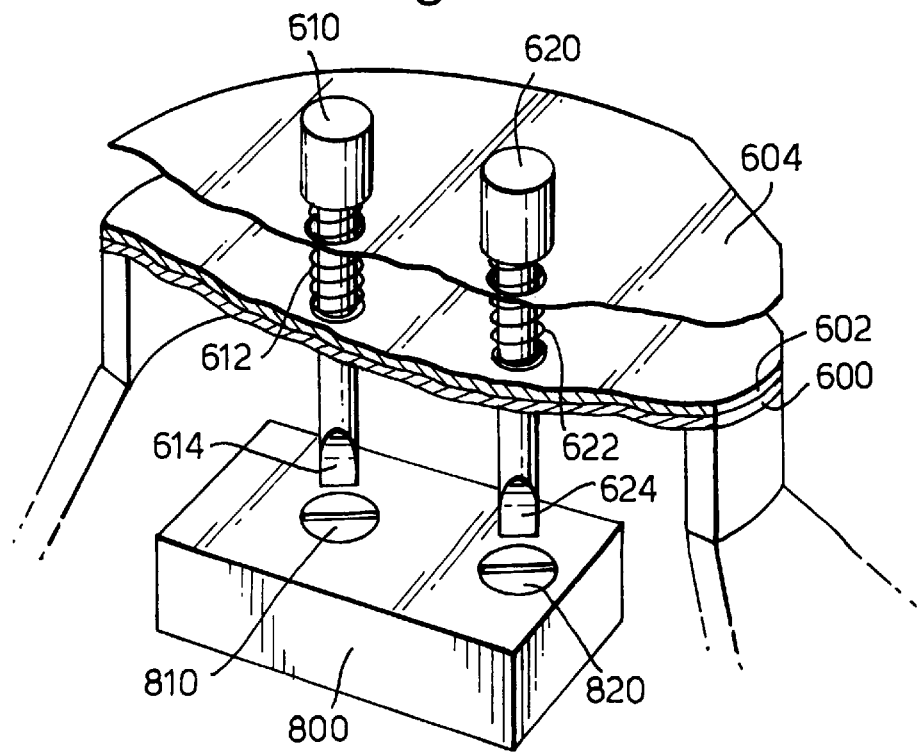
FIG. 7 shows a perspective view of the arrangement of FIG. 6 on an enlarged scale.

Referring to FIG. 6 and 7, a module 800 has adjusting screws 810, 820. In place of the conventional cover 110 shown in FIG. 2, the arrangement shown in FIG. 6 and 7 has a first member 600 partially overlain by a second member 602. First and second spring-loaded screwdrivers 610, 620 run in respective bores in members 600, 602. These bores have seals 608 which allow axial and rotational movement of screwdrivers 610, 620 while maintaining an adequate vacuum tight seal. The screwdrivers 610, 620 are urged outwardly of the enclosure by springs 612, 622 to counter balance the vacuum force which would tend to urge the screwdrivers into the interior of the chamber and to cause the thermally conductive screwdrivers to disengage from their associated adjustment screws when adjustment is not being carried out. The upper ends of the screwdrivers terminate in respective enlarged heads which provide a bearing surface for the springs. In a particularly advantageous arrangement a further plate 604 is provided spaced apart from the upper surface of member 602 by spaces 606. The screwdrivers 610, 620 run through bores in plate 604 with a clearance which allows passage of the shaft but does not allow passage of the heads. This limits the extent to which the screwdrivers may enter into the interior of the vacuum chamber. The engagement of a respective blade 614, 624 of a screwdriver with a respective adjusting screw 810, 820 provides a path for heat conduction leading to heat loss from the enclosure and a rise in temperature of the component being adjusted. Allowing the screwdrivers to engage the adjusting screws only for the brief time during which adjustments are actually being made minimises the rise in temperature of the circuit being adjusted due to conduction along the screwdriver shaft, and allows the circuit to quickly return to its operating temperature after adjustment.

While the seals do not provide a perfect long-term vacuum seal, they are adequate to maintain a sufficiently good vacuum to allow adjustment to be carried out. Once the circuits have been adjusted, the cover 600 and its associated components can be removed and replaced by a conventional cover 110. If necessary, the enclosure may be pumped while adjustments are being made to remove any air which may leak past the seals.

Figure 8:
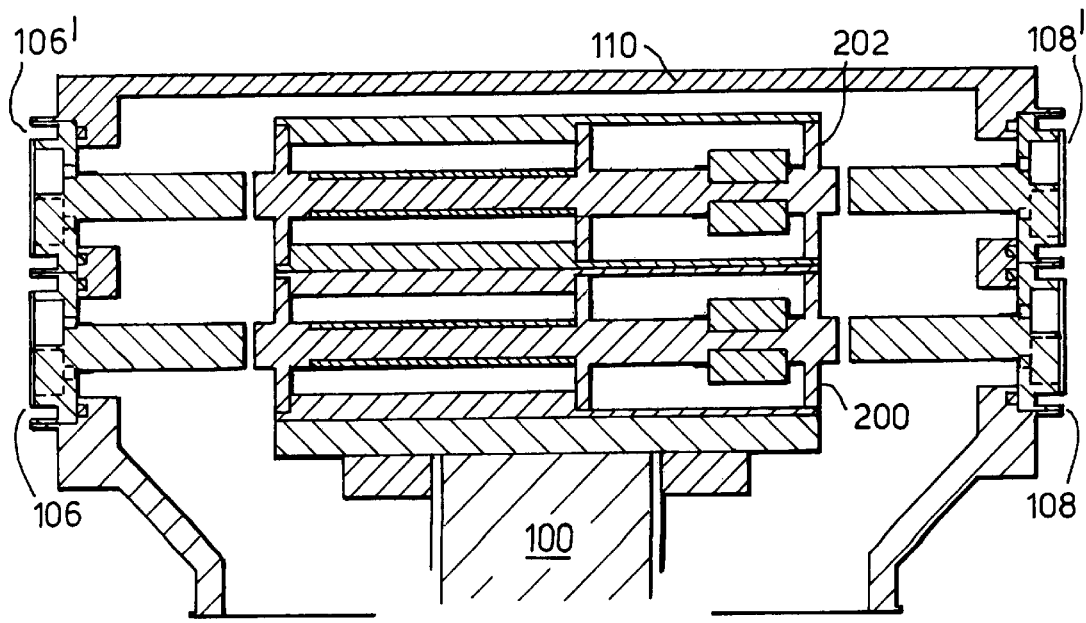
FIG. 8 shows a further aspect of the invention.

The reduction in heat loss afforded by the present invention may enable the cold finger 100 to adequately cool more than one circuit 200. In FIG. 8 the arrangement shown in FIG. 2 is modified by the provision of a further circuit assembly 202 mounted on the first circuit assembly 200. The further circuit assembly 202 is provided with a further side walls 106', 108'. The closure member 110 is attached to these further side walls. It can be seen that the circuit capacity has been doubled for a relatively small increase in volume.

Where circuits 200, 202 comprise modules such as module 800 of FIGS. 6 and 7 which require adjustment, initially only circuit 200 is mounted on the cold finger together with sidewalls 106, 108. A temporary cover is fitted as described with reference to FIGS. 6 and 7 and adjustments made. When adjustment has been completed, the temporary cover is removed, the second circuit 202 and sidewalls 106', 108' are fitted, and the temporary cover is replaced. The adjustable module of the second circuit 202 is then adjusted. When adjustment has been completed, the temporary cover is removed and the closure member 118 is fitted.

In a further modification, not shown, three circuits are stacked on top of each other. In principle, any number of circuit may be stacked subject to the capacity of the cold finger to provide adequate cooling. If adjustments are required, each adjustable module can be adjusted using a temporary cover as described above before fitting the next circuit.

Other modifications are possible within the scope of the invention. The circuit assemblies need not compromise a plurality of identical channels. Each channel may consist of a "building block" performing a different function, for example amplification, oscillation, mixing and filtering. In accordance with the invention, interconnections between the different building blocks may be made via the exterior of the housing. This allows the signals to be monitored, and individual blocks to be tested, from the outside of the enclosure. However, this is not essential, and some or all of the interconnections may be made within the enclosure.

In a further modification, one or more intermediate links may be provided between the outer links. This may further reduce the impedance discontinuity presented by the links at the expense of further heat loss.

It is to be understood that in this specification, the term "metal" encompasses alloys.

While the embodiments use through plated holes to provide a ground plane connector on the upper surface, other methods known to the skilled man may be employed.

While the described embodiment utilises a ground plane, the invention is equally applicable to balanced transmission lines having no ground plane.

The expression "substrate" encompasses any material suitable for use with microwave and/or Radio frequency applications, and encompasses semiconductors as well as insulators.

What is claimed is:

1. A first circuit assembly comprising a first substrate having a first stripline conductor arranged on a first surface thereof and having an end terminating at an edge of the first substrate, a second substrate having a second stripline conductor arranged on a first surface thereof and having an end terminating at an edge of the second substrate, means for aligning the first and second substrates with their edges spaced apart with the respective ends of the striplines aligned, means for maintaining the second substrate at a lower temperature than the first substrate, and respective first and second wire links extending between respective longitudinal edges of the end of the first stripline conductor and corresponding edges of the end of the second stripline conductor.

2. An assembly as claimed in claim 1 comprising at least one further wire link arranged intermediate the first and second links.

3. An assembly as claimed in claim 1 in which the first and second substrates comprise respective first and second ground planes arranged on respective second surfaces thereof, the first and second ground plates being electrically connected by a plurality of further wire links.

4. An assembly as claimed in claim 3 comprising at least one respective ground pad arranged on the respective first surfaces of the first and second substrates, the ground pads being electrically connected to the respective ground planes on the respective second surfaces, in which the plurality of further wire links extend between the respective ground pads.

5. An assembly as claimed in claim 1 in which at least one wire link comprises a metal having a relatively poor thermal conductivity.

6. An assembly as claimed in claim 1 wherein at least one stripline comprises a coplanar waveguide.

7. An assembly as claimed in claim 1 in which the lower temperature is a cryogenic temperature.

8. A hermetic assembly comprising a hermetically-sealed housing and an assembly as claimed in claim 7 arranged within the housing, in which the first substrate is secured to a wall of the housing, the means to maintain the second substrate are arranged within the housing, and the interior of the housing is evacuated.

9. A hermetic assembly as claimed in claim 8 in which the means to maintain the second substrate comprises a cold finger.

10. A hermetic assembly as claimed in claim 9 comprising a second circuit assembly comprising first and second substrates, said second assembly first substrate being secured to the wall of the housing and said second assembly second substrate being mounted on the first assembly second substrate.

11. A hermetic assembly as claimed in claim 10 comprising at least one further assembly comprising at least one further first and second substrates, each further first substrate being secured to the wall of the housing and each at least further second substrate being mounted on the second assembly second substrate.

* * * * *